(12) United States Patent
Marshall, Jr. et al.

(10) Patent No.: US 6,822,588 B1
(45) Date of Patent: Nov. 23, 2004

(54) PULSE WIDTH MODULATION SYSTEMS AND METHODS

(75) Inventors: Jerry A. Marshall, Jr., Corvallis, OR (US); Jeffrey G. Schoper, Corvallis, OR (US); Brian S. Watson, Dallas, OR (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/825,577

(22) Filed: Apr. 15, 2004

(51) Int. Cl.[7] ............................................. H03M 7/00
(52) U.S. Cl. ........................... 341/50; 341/51; 341/111
(58) Field of Search .......................... 341/50, 82, 83, 341/95, 53, 111, 51, 64

(56) References Cited

U.S. PATENT DOCUMENTS 5,018,524 A * 5/1991 Gu et al. ........................ 607/68
5,166,959 A * 11/1992 Chu et al. ...................... 377/20
6,040,726 A * 3/2000 Martin ......................... 327/175
6,466,087 B2 10/2002 Ruha

OTHER PUBLICATIONS

B. Patella, A. Prodic, A. Zirger and D. Maksimovic, High-Frequency Digital Controller IC for DC/DC Converters, IEEE APEC 2002, Feb. 2002, pp. 374–380.

* cited by examiner

Primary Examiner—Brian Young
Assistant Examiner—John B Nguyen

(57) ABSTRACT

Pulse width modulation systems and methods are described. In one aspect, a pulse width modulation system includes a register and a code word generator. The code word generator has an input for receiving a specified output frequency and a specified duty cycle and is operable to generate code words of different lengths. The code word generator is operable to generate a base code word having a length set to achieve the specified output frequency and having a thermometer code value set in accordance with the specified duty cycle. The code word generator is further operable to load the register with a code word pattern including a sequence of one or more copies of the base code word.

20 Claims, 3 Drawing Sheets

PULSE WIDTH MODULATION SYSTEMS AND METHODS

BACKGROUND

Pulse width modulation systems are commonly used in a wide variety of different applications, including wave generation, motor control, and anti-lock braking systems. A typical pulse width modulation system produces a variable duty cycle at a fixed frequency. With respect to an ideal pulse train of rectangular pulses, the duty cycle is the ratio of the pulse duration to the pulse period. In many approaches, the duty cycle is specified by a digital input code, and the pulse width modulation system generates a train of pulses of fixed frequency with a width proportional to the value of the digital input code.

Typical pulse width modulation systems are implemented by at least one counter, at least one magnitude comparator, and a high frequency clock. In some of these implementations, a comparator generates a pulse width modulation output based on a comparison between a reference count generated from a duty cycle input code and a clock count generated from a clock signal. A clock divider may be used to generate the clock signal from a high-speed clock signal. The divide-by parameter of the clock divider may be varied to change the frequency of the pulse width modulation signal. The operating frequencies of these types of pulse width modulation systems often are limited by the delays inherent in the counters and the magnitude comparators. In addition, propagation delays often make these designs highly sensitive to fabrication variations, reducing the manufacturability of these types of pulse width modulation systems.

SUMMARY

In one aspect of the invention, a pulse width modulation system includes a register and a code word generator. The code word generator has an input for receiving a specified output frequency and a specified duty cycle and is operable to generate code words of different lengths. The code word generator is operable to generate a base code word having a length set to achieve the specified output frequency and having a thermometer code value set in accordance with the specified duty cycle. The code word generator is further operable to load the register with a code word pattern including a sequence of one or more copies of the base code word.

In another aspect, the invention features a pulse width modulation method in accordance with which a specified output frequency and a specified duty cycle are received. The specified output frequency is selected from a set of multiple available output frequencies and the specified duty cycle is selected from a set of multiple available duty cycles. In response to the specified output frequency and the specified duty cycle, a base code word is generated. The base code word has a length set to achieve the specified output frequency and has a thermometer code value set in accordance with the specified duty cycle. A code word pattern that includes a sequence of one or more copies of the base code word is generated.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The pulse width modulation embodiments described in detail below simultaneously control the duty cycle and the output frequency of pulse width modulation output signals through the generation of specially-coded code word patterns that may be output from a register serially to produce variable frequency, variable duty cycle pulse width modulation signals. In this way, these embodiments avoid the delays and the signal propagation sensitivity often associated with pulse width modulation systems that rely on separate components, such as clock dividers and comparators, to vary the pulse width modulation frequency and to set the pulse width modulation duty cycle.

Figure 1:
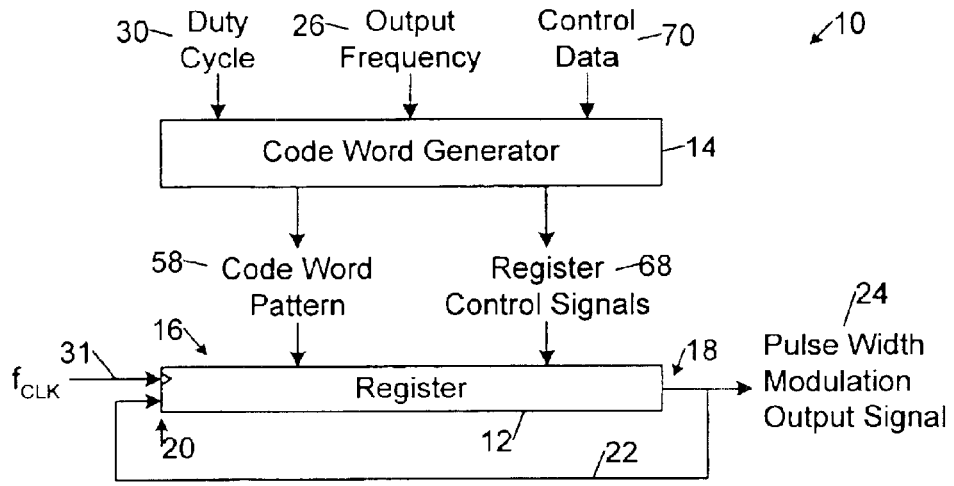
FIG. 1 is a block diagram of an embodiment of a pulse width modulation system.

FIG. 1 shows an embodiment of a pulse width modulation system 10 that includes a register 12 and a code word generator 14. The register 12 is a shift register that has a parallel input 16 and a serial output 18. The register 12 typically is a wide shift register that has a sufficient number of bits to accommodate a maximum number of available output frequencies and a maximum duty cycle resolution. In the illustrated embodiment, the register 12 includes a serial input 20 that is connected to the serial output 18 by a feedback loop 22. The code word generator 14 is not limited to any particular hardware or software configuration, but rather it may be implemented in any computing or processing environment, including in digital electronic circuitry or in computer hardware, firmware, or software.

Figure 2:
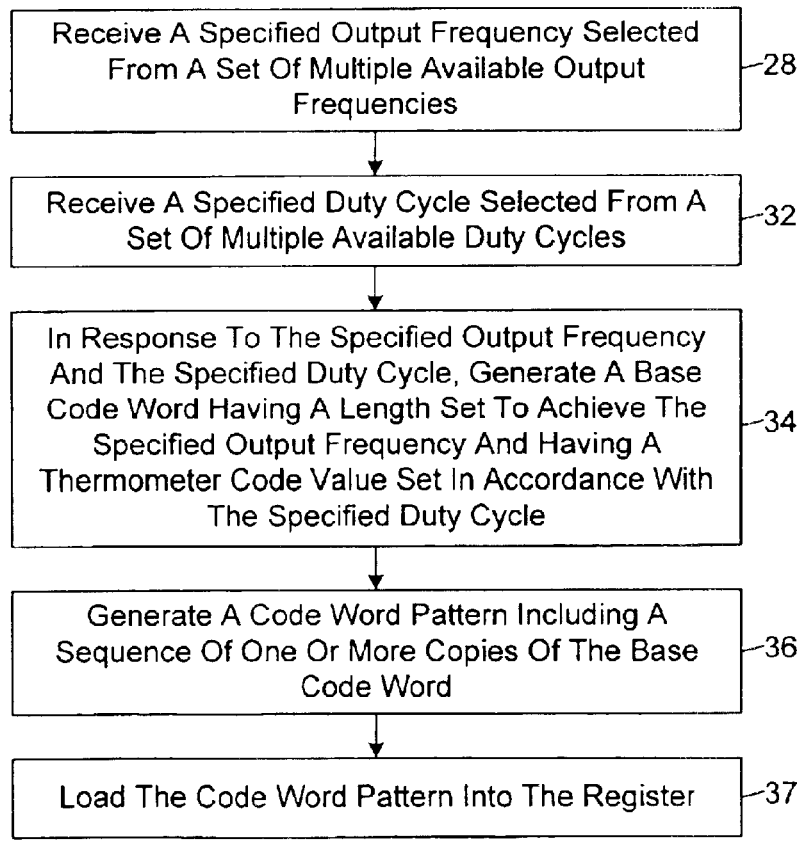
FIG. 2 is a flow diagram of an embodiment of a pulse width modulation method.

FIG. 2 shows an embodiment of a method that is implemented by the pulse width modulation system 10 to generate a variable frequency, variable duty cycle pulse width modulation output signal 24.

The code word generator 14 receives a specified output frequency 26 that is selected from a set of multiple available output frequencies (block 28). The output frequency 26 may be specified in a variety of different implementation-specific ways. For example, the output frequency 26 may be specified by a digital code word value or by a single input parameter value. In some implementations, each of the available output frequencies is a respective fraction of the frequency ($f_{CLK}$) of the clock signal 31 that is applied to the register 12.

The code word generator 14 also receives a specified duty cycle 30 that is selected from a set of multiple available duty cycles (block 32). Like the output frequency 26, the duty cycle 30 may be specified in a variety of different implementation-specific ways. For example, in some implementations, the duty cycle is specified by a K-bit binary code word, where K has an integer value of at least one, which corresponds to the resolution with which the duty cycle 30 is specified.

In response to the specified output frequency 26 and the specified duty cycle 30, the code word generator 14 generates a base code word that has a length that is set to achieve the specified output frequency and that has a thermometer code value set in accordance with the specified duty cycle 30 (block 34). In some implementations, the base code word length is set based on the resolution with which the duty cycle is specified. For example, if the duty cycle resolution is K, the base code word length is $2^K$ bits. The thermometer code is a well known encoding scheme in which $2^L-1$ digital inputs are used to represent $2^L$ digital words, where L has an integer value of at least one. The following conversion table sets forth the conversions between decimal, binary, and thermometer code words for decimal values ranging from 0 to 7.

TABLE

Conversions between decimal, binary and thermometer codes.

| Decimal | Binary | | | Thermometer Code | | | | | | |
|---|---|---|---|---|---|---|---|---|---|---|
| | $b_1$ | $b_2$ | $b_3$ | $t_1$ | $t_2$ | $t_3$ | $t_4$ | $t_5$ | $t_6$ | $t_7$ |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |
| 6 | 1 | 1 | 0 | 0 | 1 | 1 | 1 | 1 | 1 | 1 |
| 7 | 1 | 1 | 1 | 1 | 1 | 1 | 1 | 1 | 1 | 1 |

Figure 3:
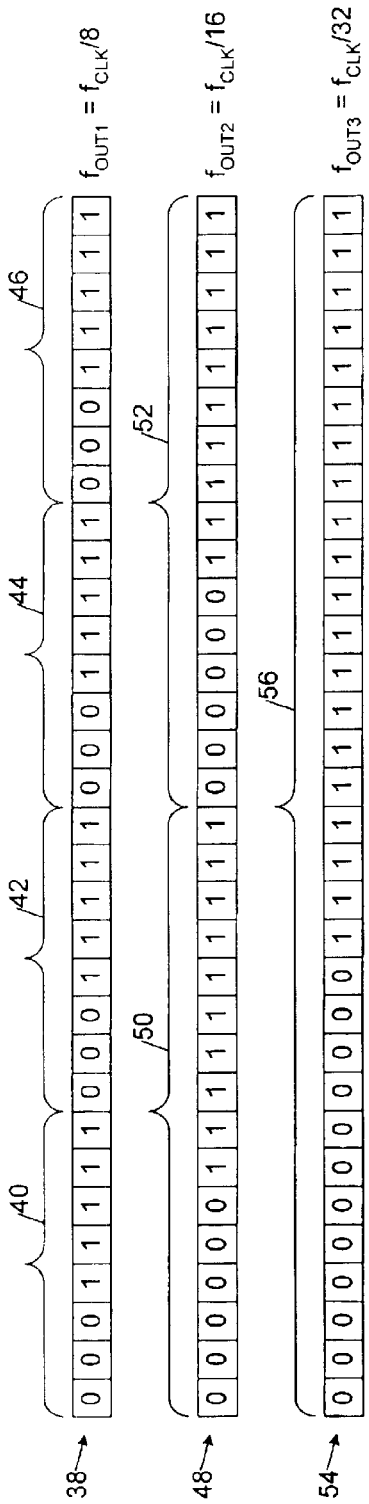
FIG. 3 is a diagrammatic view of three instances of a register loaded with three different code word patterns in accordance with the method of FIG. 2.

Referring to FIG. 3, in one illustrative example, assume that the duty cycle resolution is three bits (i.e., $2^3=8$ possible duty cycle values), the specified duty cycle is ⅝ (i.e., 62.5%), and the number of available output frequencies for the pulse width modulation signal 24 is three. The available output frequencies ($f_{OUT1}$, $f_{OUT2}$, $f_{OUT3}$) correspond to fractions of the register clocking frequency $f_{CLK}$. In this example, the output frequencies are given by $f_{OUTj}=f_{CLK}/2^{K+j-1}$ where K is the duty cycle resolution (i.e., 3 in this example), j=1, . . . , M, and M is equal to the number of available output frequencies (i.e., 3 in this example).

If the specified output frequency is $f_{OUT1}$, (i.e., j=1), the code word generator 14 generates the base code word "00011111", which has a length of $2^{K+j-1}=2^3=8$ bits and has a thermometer code value corresponding to the duty cycle value of 5 (i.e., "101" in binary code). If the specified output frequency is $f_{OUT2}$, (i.e., j=2), the code word generator 14 generates the base code word "0000001111111111", which has a length of $2^{K+j-1}=2^4=16$ bits and has a thermometer code value corresponding to the duty cycle value of 5 (i.e., "101" in binary code). If the specified output frequency is $f_{OUT3}$ (i.e., j=3), the code word generator 14 generates the base code word "00000000000001111111111111111111", which has a length of $2^{K+j-1}=2^5=32$ bits and has a thermometer code value corresponding to the duty cycle value of 5 (i.e., "101" in binary code).

Referring back to FIG. 2, the code word generator 14 generates a code word pattern that includes enough copies of the base code word to completely load the bits of the register 12 (block 36). The code word generator 14 loads the generated code word pattern into the register 12 (block 37). In the above-described example, if the specified output frequency is $f_{OUT1}$, the code word generator 14 loads the 32-bit wide register 12 with a code word pattern 38 that consists of four copies 40, 42, 44, 46 of the 8-bit base code word "00011111". If the specified output frequency is four, the code word generator 14 loads the 32-bit wide register 12 with a code word pattern 48 that consists of two copies 50, 52 of the 16-bit base code word "0000001111111111". If the specified output frequency is $f_{OUT3}$, the code word generator 14 loads the 32-bit wide register 12 with a code word pattern 54 that consists of one copy 56 of the 32-bit base code word "00000000000001111111111111111111".

Figure 4:
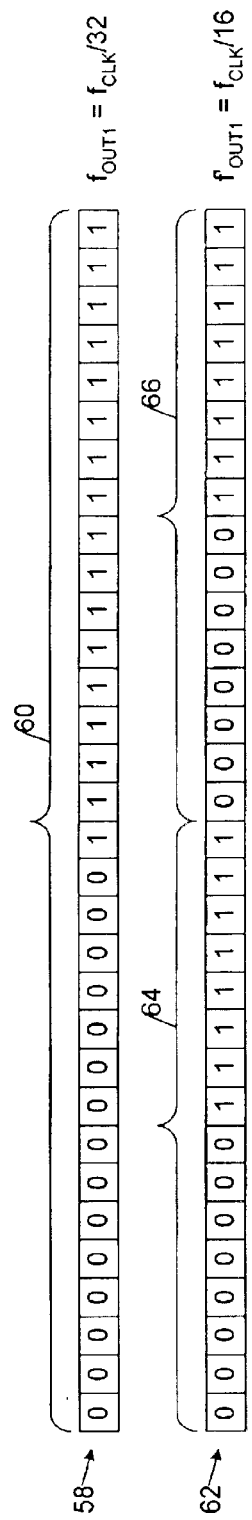
FIG. 4 is a diagrammatic view of two instances of a register loaded with two different code word patterns in accordance with the method of FIG. 2.

Referring to FIG. 4, in another illustrative example, assume that the duty cycle resolution is 5 bits (i.e., $2^5=32$ possible duty cycle values) and the specified duty cycle is 17/32 (i.e., 53.125%). In this example, the register 12 is assumed to have a width of 32 bits and, therefore, only one output frequency ($f_{OUT1}$) is possible for the pulse width modulation signal 24. The output frequency is given by $f_{OUT1}=f_{CLK}/2^{K-j-1}$. In this example, K=5 and j=1, resulting in $f_{OUT1}=f_{CLK}/32$. The code word generator 14 generates the base code word "000000000000000111111111111111111", which has a length of $2^{K-j-1}=2^5=32$ bits and has a thermometer code value corresponding to the duty cycle value of 17 (i.e., "01001" in 5-bit binary code). The code word generator 14 loads the 32-bit wide register 12 with a code word pattern 58 that consists of one copy 60 of the 32-bit base code word "000000000000000111111111111111111".

In some implementations, if the specified output frequency is greater than the threshold $f_{CLK}/32$, the code word generator 14 is operable to reduce the duty cycle resolution K to achieve the specified output frequency. In some of these implementations, the code word generator 14 reduces the duty cycle resolution from K to K-h to achieve an output frequency $f_{CLK}/2^{K-h+j-1}$, where h has in integer value ranging from 1 to K-1. In the example of FIG. 4, K=5 and j=1 and, therefore, the possible output frequencies higher than $f_{CLK}/32$ are given by $f_{CLK}/2^{5-h}$, where h corresponds to the number of bits by which the duty cycle resolution is reduced. In the example shown in FIG. 4, the duty cycle resolution is reduced by one bit (i.e., h=1) to achieve the higher output frequency $f_{OUT1}=f_{CLK}/16$. The code word generator 14 generates the base code word "0000000011111111", which has a length of $2^{K-h+j-1}=2^4=16$ bits and has a thermometer code value corresponding to a duty cycle resolution of 17/2=8.5 (i.e., 1001.1 in 5-bit binary code) truncated at the radix to approximate the 4-bit duty cycle resolution. The code word generator 14 loads the 32-bit wide register 12 with a code word pattern 62 that consists of two copies 64, 66 of the base code word "00000000000000001111111111111111".

In the embodiment illustrated in FIG. 1, the code word generator 14 loads the generated code word pattern into the register 12 once for a given specified duty cycle 30 and output frequency 26. After the code word pattern has been loaded, the register 12 outputs the code word pattern serially from output 18. The output bits are fed back to the serial input 20, allowing the register to continue to generate the pulse width modulation output signal 24 without re-loading the code word pattern from the code word generator 14. In this regard, the code word generator 14 generates register control signals 68 from control data 70 received from an external source. The register control signals 68 control the parallel loading of the code word pattern and the serial loading of the pulse width modulation output signal 24 fed back from the output 18 to the serial input 20. In other embodiments, the code word generator 14 may be configured to continuously load bits into the register 12 serially to replace the bits that are shifted out to produce the pulse width modulation output signal 24.

Figure 5:
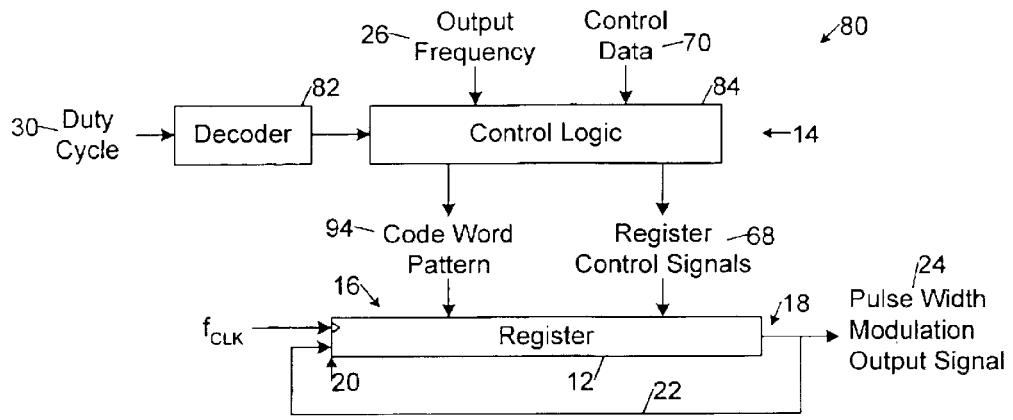
FIG. 5 is a block diagram of an implementation of the pulse width modulation system of FIG. 1.

FIG. 5 shows an implementation 80 of the pulse width modulation system 10 in which the code word generator 14 is implemented by a decoder 82 and control logic 84. In some implementations, the duty cycle 30 is specified by a K-bit binary word and the decoder 82 decodes the binary word into a $2^K$-bit is thermometer code word (e.g., if the duty cycle code word is "101", the decoder 82 decodes the duty cycle code word into "00011111"), where K has an integer value of 1 to N, and N has an integer value corresponding to the maximum number of input bit lines to the decoder 82.

The decoder 82 may be any type of binary-to-thermometer-code decoder and the control logic 84 may be any type of logic processing architecture that is configured to provide the functionality described below. The decoder 82 and the control logic 84 are not limited to any particular hardware or software configuration, but rather they may be implemented in any computing or processing environment, including in digital electronic circuitry or in computer hardware, firmware, or software.

Figure 6:
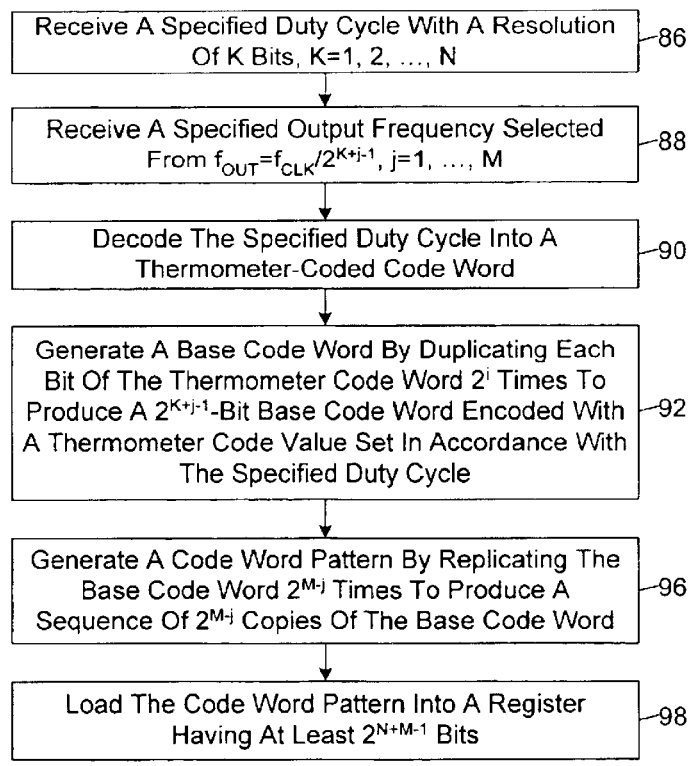
FIG. 6 is a flow diagram of an embodiment of a pulse width modulation method that is implemented by the pulse width modulation system of FIG. 5.

Referring to FIG. 6, in some implementations, the pulse width modulation system implementation 80 generates the pulse width modulation output signal 24, as follows. The decoder 82 receives the specified duty cycle 30 with a resolution of K bits (block 86). The decoder 82 decodes the specified duty cycle into a thermometer-coded code word (block 88). The control logic 84 receives the specified output frequency 26, which is selected from the set of $f_{OUT}=f_{CLK}/2^{K+j-1}$, where j=1, ..., M, and M has an integer value equal to the total number of available frequencies (block 90). The control logic 84 generates a base code word by duplicating each bit of the thermometer code word received from the decoder 82 $2^{j-1}$ times to produce a $2^{K+j-1}$-bit base code word encoded with a thermometer code value set in accordance with the specified duty cycle (block 92).

Thus, in the example described above in connection with FIG. 3, where k=j=3 and the duty cycle code word is "101", the decoder 82 converts the duty cycle code word to "00011111" (block 88). If the specified output frequency corresponds to j=1 (i.e., $f_{OUT1}=f_{CLK}/2^3$), the control logic 84 generates a base code word $2^0=1$ times to produce a $2^3$-bit code word encoded with a thermometer code value set in accordance with the specified duty cycle (i.e., "00011111") (block 92). If the specified output frequency corresponds to j=2 (i.e., $f_{OUT2}=f_{CLK}/2^4$), the control logic 84 generates a base code word $2^1=2$ times to produce a $2^4$-bit code word encoded with a thermometer code value set in accordance with the specified duty cycle (i.e., "0000001111111 ") (block 92). If the specified output frequency corresponds to j=3 (i.e., $f_{OUT3}=f_{CLK}/2^5$), the control logic 84 generates a is base code word $2^2=4$ times to produce a $2^5$-bit code word encoded with a thermometer code value set in accordance with the specified duty cycle (i.e., "00000000000011111111111111111111") (block 92).

After the base code word has been generated (block 92), a code word pattern 94 is generated by replicating the base code word $2^{M-j}$ times to produce a sequence of $2^{M-j}$ copies of the base code word (block 96). Again considering the example described above in connection with FIG. 3, if j=1 the control logic 84 replicates the base code word "00011111" $2^2=4$ times to produce a sequence of four copies of the base code word. If j=2, the control logic 84 replicates the base code word "0000001111111" $2^1=2$ times to produce a sequence of two copies of the base code word. If j=3, the control logic 84 replicates the base code word "00011111" $2^0=1$ times to produce a sequence of one copies of the base code word.

After the code word pattern 94 has been generated (block 96), the control logic 84 loads the code word pattern into register 12, which has at least $2^{N+M-1}$ bits (block 98).

Other embodiments are within the scope of the claims.

What is claimed is:

1. A pulse width modulation system, comprising:
    a register; and
    a code word generator having an input for receiving a specified output frequency and a specified duty cycle and being operable to generate code words of different lengths, wherein the code word generator is operable to generate a base code word having a length set to achieve the specified output frequency and having a thermometer code value set in accordance with the specified duty cycle, the code word generator being further operable to load the register with a code word pattern including a sequence of one or more copies of the base code word.

2. The pulse width modulation system of claim 1, wherein the register has a parallel input and a serial output.

3. The pulse width modulation system of claim 2, wherein the register further has a serial input connected to the serial output.

4. The pulse width modulation system of claim 1, wherein the code word generator comprises a decoder having an input for receiving the specified duty cycle and being operable to decode the specified duty cycle into a thermometer code word.

5. The pulse width modulation system of claim 4, wherein the duty cycle is specified by an K-bit binary word and the decoder is operable to decode the binary word into a $2^K$-bit thermometer code word.

6. The pulse width modulation system of claim 4, wherein the register is clocked at a frequency $f_{CLK}$ and the specified output frequency $f_{OUT}$ is given by $f_{OUT}=f_{CLK}/2^{K+j-1}$, where j has an integer value from 0 to M, M has an integer value of at least 1, and K has an integer value equal to the bit resolution with which the duty cycle is specified.

7. The pulse width modulation system of claim 6, wherein the code word generator is operable to generate the base code word by duplicating each bit of the thermometer code word $2^{j-1}$ times and assembling the duplicated bits into a $2^{K+j-1}$-bit base code word encoded with a thermometer code value set in accordance with the specified duty cycle.

8. The pulse width modulation system of claim 6, wherein the code word generator is operable to load the register with a code word pattern including $2^{M-j}$ copies of the base code word.

9. The pulse width modulation system of claim 6, wherein the register has at least $2^{K+M-1}$ bits.

10. The pulse width modulation system of claim 1, wherein the code word generator is operable to reduce duty cycle resolution to achieve the specified output frequency when the specified output frequency is greater than a threshold output frequency.

11. A pulse width modulation method, comprising:
    receiving a specified output frequency selected from a set of multiple available output frequencies and a specified duty cycle selected from a set of multiple available duty cycles;
    in response to the specified output frequency and the specified duty cycle, generating a base code word having a length set to achieve the specified output frequency and having a thermometer code value set in accordance with the specified duty cycle; and generating a code word pattern including a sequence of one or more copies of the base code word.

12. The pulse width modulation method of claim 11, further comprising loading the generated code word pattern into a register having an output for delivering a pulse width modulation signal at the specified output frequency and with the specified duty cycle.

13. The pulse width modulation method of claim 12, further comprising feeding the pulse width modulation signal back to an input of the register.

14. The pulse width modulation method of claim 11, further comprising decoding the specified duty cycle into a thermometer code word.

15. The pulse width modulation method of claim 14, wherein the duty cycle is specified by an K-bit binary word and the decoder is operable to decode the binary word into a $2^K$-bit thermometer code word.

16. The pulse width modulation method of claim 14, wherein the specified output frequency $f_{OUT}$ is given by $f_{OUT} = f_{CLK}/2^{K+j-1}$, where $f_{CLK}$ is a register clocking frequency, i has an integer value from 0 to M, M has an integer value of at least 1, and K has an integer value equal to the bit resolution with which the duty cycle is specified.

17. The pulse width modulation method of claim 16, wherein the base code word is generated by duplicating each bit of the thermometer code word $2^j$ times and assembling the duplicated bits into a $2^{K+j-1}$-bit base code word encoded with a thermometer code value set in accordance with the specified duty cycle.

18. The pulse width modulation method of claim 16, wherein the generated code word pattern includes $2^{M-j}$ copies of the base code word.

19. The pulse width modulation method of claim 16, further comprising loading the generated code word pattern into a register having at least $2^{K+M-1}$ bits.

20. The pulse width modulation method of claim 11, further comprising reducing duty cycle resolution to achieve the specified output frequency when the specified output frequency is greater than a threshold output frequency.

* * * * *